United States Patent
Hsu

(10) Patent No.: US 10,629,661 B2
(45) Date of Patent: Apr. 21, 2020

(54) ORGANIC LIGHT EMITTING DIODE ARRAY SUBSTRATE WITH AN ORGANIC LIGHT EMITTING LAYER ON A PIXEL ELECTRODE LAYER AND AN ELECTRODE LAYER ON THE ORGANIC LIGHT EMITTING LAYER, METHOD FOR MANUFACTURING THE SAME AND DISPLAY WITH THE SAME

(71) Applicant: BOE TECHNOLOGY GROUP CO., LTD., Beijing (CN)

(72) Inventor: Minghung Hsu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/526,710

(22) PCT Filed: Aug. 31, 2016

(86) PCT No.: PCT/CN2016/097629
§ 371 (c)(1),
(2) Date: May 12, 2017

(87) PCT Pub. No.: WO2017/059754
PCT Pub. Date: Apr. 13, 2017

(65) Prior Publication Data
US 2017/0317152 A1   Nov. 2, 2017

(30) Foreign Application Priority Data

Oct. 10, 2015   (CN) .......................... 2015 1 0652328

(51) Int. Cl.
*H01L 27/32* (2006.01)
*H01L 21/77* (2017.01)
(Continued)

(52) U.S. Cl.
CPC .......... *H01L 27/3246* (2013.01); *H01L 21/77* (2013.01); *H01L 27/12* (2013.01);
(Continued)

(58) Field of Classification Search
CPC ..... H01L 51/50; H01L 51/52; H01L 51/5262; H01L 51/5271; H01L 27/3246;
(Continued)

(56) References Cited

U.S. PATENT DOCUMENTS

2003/0107314 A1* 6/2003 Urabe .................. H01L 27/322
                                                    313/506
2016/0365386 A1* 12/2016 Liu ........................ G02B 5/223

FOREIGN PATENT DOCUMENTS

CN        1556421 A      12/2004
CN      101661997 A       3/2010
(Continued)

OTHER PUBLICATIONS

English machine translation of JP2000-162625A.*
(Continued)

*Primary Examiner* — Laura M Menz
*Assistant Examiner* — Candice Chan
(74) *Attorney, Agent, or Firm* — Kinney & Lange, P.A.

(57) ABSTRACT

An embodiment of the present disclosure provides an organic light emitting diode array substrate, an organic light emitting diode display and a method for manufacturing the same. Specifically, the organic light emitting diode array substrate comprises a substrate; a reflecting layer provided on the substrate; a photoresist layer provided on the reflecting layer, and a pixel electrode layer provided on the photoresist layer.

14 Claims, 4 Drawing Sheets

(51) Int. Cl.
  *H01L 27/12* (2006.01)
  *H01L 51/52* (2006.01)
  *H01L 51/00* (2006.01)

(52) U.S. Cl.
  CPC ............ *H01L 27/32* (2013.01); *H01L 27/322* (2013.01); *H01L 51/0021* (2013.01); *H01L 51/5231* (2013.01); *H01L 51/5237* (2013.01); *H01L 51/5271* (2013.01); *H01L 51/5284* (2013.01); *H01L 51/524* (2013.01)

(58) Field of Classification Search
  CPC ....... H01L 27/12; H01L 27/32; H01L 27/322; H01L 21/77; H01L 51/5284; H01L 52/5237; H01L 51/5231; H01L 51/0021; H01L 51/524
  See application file for complete search history.

(56) References Cited

FOREIGN PATENT DOCUMENTS

| | | |
|---|---|---|
| CN | 102269834 A | 12/2011 |
| CN | 102856351 A | 1/2013 |
| CN | 104391349 A | 3/2015 |
| CN | 105140247 A | 12/2015 |
| JP | 2000162625 A | 6/2000 |

OTHER PUBLICATIONS

First Chinese Office Action, for Chinese Patent Application No. 201510652328.6, dated Jul. 28, 2017, 11 pages.

English translation of International Search Report and Written Opinion dated Dec. 5, 2016, for corresponding PCT Application No. PCT/CN2016/097629.

* cited by examiner

ORGANIC LIGHT EMITTING DIODE ARRAY SUBSTRATE WITH AN ORGANIC LIGHT EMITTING LAYER ON A PIXEL ELECTRODE LAYER AND AN ELECTRODE LAYER ON THE ORGANIC LIGHT EMITTING LAYER, METHOD FOR MANUFACTURING THE SAME AND DISPLAY WITH THE SAME

CROSS-REFERENCE TO RELATED APPLICATION

This application claims the benefit of Chinese Patent Application No. 201510652328.6 filed on Oct. 10, 2015 in the State Intellectual Property Office of China, the whole disclosure of which is incorporated herein by reference.

FIELD OF THE INVENTION

The present invention relates to an organic light emitting diode array substrate, an organic light emitting diode display, and a method for manufacturing an organic light emitting diode array substrate.

DESCRIPTION OF THE RELATED ART

Since the organic light emitting display device has a characteristic of self-luminous, it is unnecessary to provide an additional light source, which is advantageous for miniaturization and weight reduction. In addition, since the organic light emitting display device has characteristics such as low power consumption, high luminance, and fast response speed, it is considered to be a next generation display device to which attention has been paid. The organic light emitting display device includes an anode, an organic light emitting layer and a cathode. Holes formed in the anode and electrons injected from the cathode are combined in the organic light emitting layer to form excitones, and the organic light emitting display device emits light through energy generated when the excitones switch from an excited state to a ground state. The organic light emitting layer may comprise a plurality of organic light emitting layers of red, green and blue. Since the organic light emitting layers of red, green and blue have different luminous efficiencies, it is possible to adjust the luminous efficiency thereof respectively to be the same by forming a plurality of organic light emitting layers of red, green and blue with different thicknesses, or by forming a plurality of protective layers of different thicknesses which are corresponding to the plurality of organic light emitting layers of red, green and blue colors respectively.

On the other hand, in order to solve the problem of the aperture ratio and the life of the display, an upper display structure of the solution process is generally proposed. However, in a conventional display architecture, its packaging process results in a larger box thickness, a high reflectivity of the display, and the display color gamut of the display being affected by the black matrix and the color filter resistors on a cover plate thereof, and therefore it is necessary to sacrifice the aperture ratio or side view display quality in design.

Specifically, since the package process results in a larger box thickness, the display is easily to be blocked by a black matrix (BM) when it is illuminated in large viewing angle, and will cause problems such as asymmetry in the left and right viewing angles and light leakage when there is an offset generated during assembling.

In the process of designing the display, there are generally two design methods: one of which is increasing width of the BM and shielding region, with a disadvantage of reducing the aperture rate and negative effects on the life of the display; the other of which is reducing width of the BM to avoid light shielding, with a disadvantage of a little of light leakage through other sub-pixels and that the display presents a higher reflectivity (due to a reduced BM area).

SUMMARY OF THE INVENTION

The present invention has been made to overcome or alleviate at least one aspect of the above mentioned disadvantages.

To achieve above mentioned objection, according to an aspect of the present invention, there is provided an organic light emitting diode array substrate comprising a substrate; a reflecting layer provided on the substrate; a photoresist layer provided on the reflecting layer, and a pixel electrode layer provided on the photoresist layer.

Alternatively, the photoresist layer comprises a plurality of red filter photoresist regions, green filter photoresist regions and blue filter photoresist regions which are arranged in sequence, any adjacent two or adjacent three of the plurality of red filter photoresist regions, green filter photoresist regions and blue filter photoresist regions are overlapped mutually.

Alternatively, the reflecting layer comprises a plurality of reflecting regions which are made of metal and spaced apart, each reflecting region being arranged in correspondence with pixel electrodes in the pixel electrode layer.

Alternatively, a thickness of the photoresist region is less than or equivalent to 2 micron.

Alternatively, the organic light emitting diode array substrate further comprises an organic light emitting layer of an organic light emitting device provided on the pixel electrode layer, and an electrode layer of the organic light emitting device provided on the organic light emitting layer.

Alternatively, one of the pixel electrodes in the pixel electrode layer serves as an anode of a corresponding organic light emitting device, and one of the electrodes in the electrode layer of the organic light emitting device serves as a cathode of a corresponding organic light emitting device.

Alternatively, the anode is a transparent electrode, and the cathode is a semi-transparent and semi-reflecting electrode or a transparent electrode.

Alternatively, one of the pixel electrodes in the pixel electrode layer serves as a cathode of a corresponding organic light emitting device, and one of the electrodes in the electrode layer of the organic light emitting device serves as an anode of a corresponding organic light emitting device.

Alternatively, the cathode is a transparent electrode, and the anode is a semi-transparent and semi-reflecting electrode or a transparent electrode.

Alternatively, the organic light emitting device comprises a plurality of red organic light emitting device, green organic light emitting device and blue organic light emitting device which are arranged in sequence, a first pixel definition region being provided at each overlapping region and a second pixel definition region being provided between the first pixel definition region and a corresponding organic light emitting device.

Alternatively, a metal film layer is provided between the pixel electrode in the pixel electrode layer and a corresponding organic light emitting layer.

Alternatively, the metal film layer is made of magnesium, indium, or a combination thereof.

According to another aspect of the present invention, there is provided an organic light emitting diode display, comprising
   an above mentioned organic light emitting diode array substrate; and
   a cover plate assembly.

Alternatively, the cover plate assembly includes a cover plate and a light barrier disposed on the cover plate at a position corresponding to the first pixel definition region on the organic light emitting diode array substrate.

According to yet another aspect of the present invention, there is provided a method for manufacturing an organic light emitting diode array substrate, wherein the organic light emitting diode array substrate is the above mentioned organic light emitting diode array substrate, and the method comprises the steps of:
   forming a reflecting layer on the substrate;
   forming a photoresist layer on the reflecting layer;
   forming in turn a pixel electrode layer, second pixel definition regions, and first pixel definition regions on the photoresist layer, wherein the photoresist layer comprises red, green and blue filter photoresist regions arranged in sequence, the first pixel definition regions being arranged at overlapping regions of two or three of red, green and blue filter photoresist regions which are adjacent to each other or one another, and the second pixel definition regions being located between the corresponding organic light emitting device and the corresponding first pixel definition region; and
   forming an organic light emitting layer of the organic light emitting device on the organic light emitting diode array substrate and forming an electrode layer of the organic light emitting device on the organic light emitting layer.

Alternatively, a metal film layer is to be formed before forming the electrode layer of the organic light emitting device, after forming the organic light emitting layer on the organic light emitting diode array substrate.

Alternatively, forming the metal film layer by thermal evaporation, and forming the electrode layer of the organic light emitting device by electron gun vapor deposition or physical vapor deposition.

Alternatively, forming the organic light emitting device by a solution process, a thermal evaporation process, or a combination thereof

BRIEF DESCRIPTION OF THE DRAWINGS

These and/or other aspects and advantages of the present invention will become apparent and be readily understood from the following description of the preferred embodiments taken in conjunction with the accompanying drawings in which.

DETAILED DESCRIPTION OF PREFERRED EMBODIMENTS OF THE INVENTION

Figure 1:
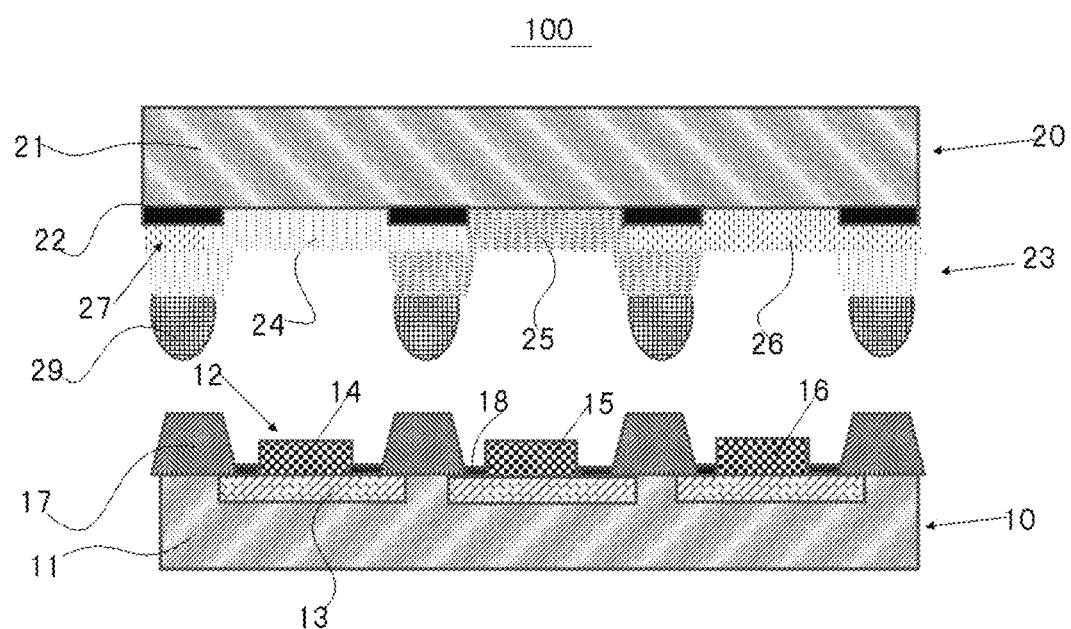
FIG. 1 is a schematic view of a structure of an organic light emitting diode display in the prior art.

The technical solution of the present invention will be described in further detail with reference to the following embodiments, taken in conjunction with the accompanying drawings. In the specification, the same or similar reference numerals indicate the same or similar parts. The following description of embodiments of the invention with reference to the accompanying drawings is intended to explain the general inventive concept of the invention and is not intended to be limiting of the invention.

As shown in FIG. 1, a schematic view of a structure of an organic light emitting diode display in the prior art is illustrated. Specifically, an organic light emitting diode display 100 comprises a TFT array substrate assembly 10 and a cover assembly 20. A film transistor array is provided on a substrate 11 of the TFT array substrate assembly 10. In the organic light emitting diode display 100, the film transistor circuit is used to control each pixel to implement light-emitting per unit.

Specifically, the cover assembly 20 includes a cover plate 21, a black matrix (BM) 22, a photoresist layer 23, and a light barrier 29 from top to bottom. The black matrix 22 is arranged to be spaced apart in a predetermined manner. The photoresist layer 23 may be a color filter photoresist layer and comprises a red filter photoresist region 24, a green filter resist region 25 and a blue filter photoresist region 26 arranged in sequence, where two adjacent filter photoresist regions of the red, green and green filter photoresist regions 24, 25, and 26 are overlapped with each other, thereby forming a plurality of overlapping regions 27. The light barriers 29 are provided on each of the overlapping regions 27 to prevent light from the organic light emitting devices of the corresponding sub-pixels from entering into the other sub-pixel regions (which will be described in detail hereinafter). At the overlapping region 27, a black matrix 22 is provided correspondingly between the photoresist layer 23 and the cover plate 21.

The TFT array substrate assembly 10 is further provided with an organic light emitting device 12 located in a corresponding sub-pixel region on a substrate (for example, a TFT array substrate) 11. The organic light emitting device 12 may include red, green and blue organic light emitting devices. Each organic light emitting device includes an anode, an organic light emitting layer and a cathode. Specifically, the anode 13, the organic light emitting layers 14, 15 and 16 and the cathode of the organic light emitting device are illustrated. In other words, the organic light emitting layer may be a red organic light emitting layer 14, a green organic light emitting layer 15 and a blue organic light emitting layer 16, which may emit red, green and blue light, respectively. Each organic light emitting layer is spaced apart from the adjacent organic light emitting layer by a first pixel definition region 17, and a second pixel definition region 18 is provided between the corresponding organic light emitting layers 14, 15, 16 and the first pixel definition region 17. As shown in FIG. 1, the height of the first pixel definition region 17 is higher than that of the other parts in the corresponding sub-pixel region.

Generally, three sub-pixels including the red organic light emitting layer 14, the green organic light emitting layer 15 and the blue organic light emitting layer 16, respectively, may be considered as one pixel unit. Of course, it is possible to select specific composition and quantity of the sub-pixels included in each pixel unit as necessary. In the context, by way of example, a pixel unit with three above mentioned sub-pixels will be described.

As such, since the arrangement of the black matrix 22 and the photoresist layer 23 on the cover plate 21 causes problems such as a larger thickness of the box, a high reflectivity and display color gamut of the organic light emitting diode display 100, it is necessary to sacrifice the aperture ratio or side view display quality in design.

Figure 2:
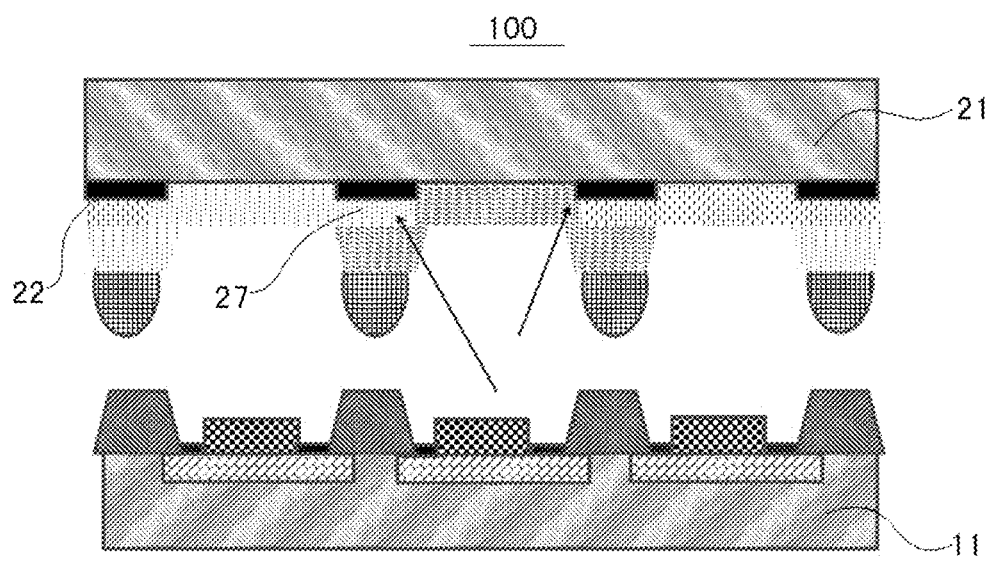
FIG. 2 is a schematic view of the organic light emitting diode display shown in FIG. 1 in a case that it has side lights.

Specifically referring to FIG. 2, when the organic light emitting diode display 100 shown in FIG. 1 emits light at a large viewing angle (indicated by an arrow in the figure), the lights are easily to be blocked by the black matrix 22, which fact may cause problems such as asymmetry in the left and right viewing angles and light leakage when there is an offset generated during assembling.

In view of the deficiencies or disadvantage of the organic light emitting diode display 100 in the prior art described above, the present invention provides a novel organic light emitting diode display 200.

Figure 3:
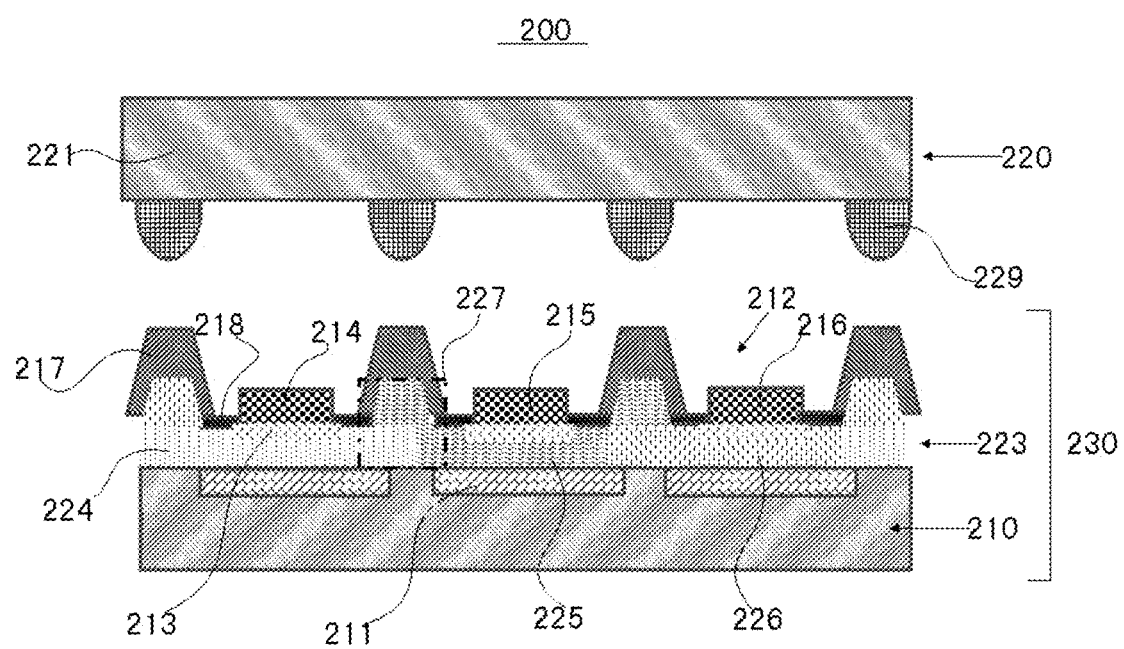
FIG. 3 is a schematic view of a structure of an organic light emitting diode display according to an embodiment of the present invention.

Referring to FIG. 3, a schematic view of a structure of an organic light emitting diode display 200 according to an embodiment of the present invention is illustrated. The organic light emitting diode display 200 comprises an organic light emitting diode array substrate 230 and a cover plate assembly 220 which cooperates with the organic light emitting diode array substrate 230. The organic light emitting diode array substrate 230 may comprise a substrate 210, a reflecting layer 211, a photoresist layer 223 and a pixel electrode layer 213. The substrate 210 may be a TFT array substrate or a substrate which similarly has a corresponding function. The cover plate assembly 220 comprises a cover plate 221 and a plurality of light barrier 229 which are spaced apart from one another on the cover plate 221.

Specifically, the reflecting layer 211 is provided on the TFT array substrate 210. The reflecting layer 211 may be made of metal, for example, a metal suitable for reflecting light. The photoresist layer 223 may be a color filter photoresist layer and be located on the reflecting layer 211. The color in the photoresist layer 223 may be selected depending on specific requirements and design. The pixel electrode layer 213 is provided on the photoresist layer 223.

In an embodiment, the photoresist layer 223 comprises a plurality of red filter photoresist regions 224, green filter photoresist regions 225 and blue filter photoresist regions 226 which are arranged in sequence, any adjacent two or adjacent three of the plurality of red filter photoresist regions 224, green filter photoresist regions 225 and blue filter photoresist regions 226 are overlapped each other or one another to form a plurality of overlapping regions 227. As shown in FIG. 3, in the present embodiment, only two adjacent filter resist regions are shown overlapping each other. Of course, those skilled in the art may select the number of filter photoresist regions that overlap each other as desired. One of the overlapping regions is shown by a dashed box 227 in FIG. 3.

Specifically, the reflecting layer 211 comprises a plurality of reflecting regions which are made of metal and spaced apart, i.e., the layer in which the reflecting regions are located is called a reflecting layer. Each reflecting region is arranged in correspondence with pixel electrodes in the pixel electrode layer, or each reflecting region is arranged in correspondence with one of the red filter photoresist regions 224, green filter photoresist regions 225 and blue filter photoresist regions 226. In an embodiment, a thickness of the photoresist region is less than or equivalent to 2 micron.

Further, the organic light emitting diode array substrate 230 further comprises an organic light emitting layer 214, 215 and 216 of an organic light emitting devices provided on the pixel electrode layer 213, and an electrode layer of the organic light emitting devices provided on the organic light emitting layer 214, 215 and 216.

Each of the organic light emitting devices 212 includes an anode, an organic light emitting layer and a cathode arranged in a sandwich structure. Thus, in one example, a pixel electrode in the pixel electrode layer 213 serves as an anode of a corresponding organic light emitting device 212, and an electrode in the electrode layers of the organic light emitting device 212 is a cathode of the corresponding organic light emitting device. The anode is a transparent electrode, for example made of ITO material. The cathode may be a non-transparent electrode, a semi-transparent and semi-reflecting electrode or a transparent electrode, for example, a transparent electrode made of ITO material. In this example, the anode is disposed closer to the TFT array substrate 210 than the cathode.

In an alternative embodiment, one of the pixel electrodes in the pixel electrode layer 213 serves as a cathode of a corresponding organic light emitting device 212, and one of the electrodes in the electrode layer of the organic light emitting device 212 serves as an anode of a corresponding organic light emitting device 212. The cathode is a transparent electrode, for example made of ITO material. The anode may be an opaque electrode, a semi-transparent and semi-reflecting electrode or a transparent electrode, for example a transparent electrode made of ITO material. Of course, in the alternative example, the cathode is disposed closer to the TFT array substrate 210 than the anode.

As shown in the Figure, a plurality of organic light emitting devices are provided on the substrate 210, which comprise a plurality of red organic light emitting devices, green organic light emitting devices and blue organic light emitting devices which are arranged in sequence. A first pixel definition region 217 is provided at each overlapping region 227 and a second pixel definition region 218 is provided between the first pixel definition region 227 and a corresponding organic light emitting device 212.

As illustrated, the light barrier 229 is provided on the cover plate 221 at a position corresponding to the first pixel definition region 217 on the substrate 210.

Each organic light emitting device 212 is located in a corresponding sub-pixel region. Specifically, the anode 213, the organic light emitting layers 214, 215 and 216, and the cathode of a organic light emitting device are illustrated. In one example, the organic light emitting layer may be a red organic light emitting layer 214, a green organic light emitting layer 215, and a blue organic light emitting layer 216. Each organic light emitting layer is spaced apart from the adjacent organic light emitting layer by the first pixel definition region 217, and a second pixel definition region 218 is provided between the corresponding organic light emitting layer and the first pixel definition region 217. As shown in FIG. 3, the height of the first pixel definition region 217 is higher than that of other parts in the corresponding sub-pixel region.

Generally, three sub-pixels each including the red organic light emitting layer 214, the green organic light emitting layer 215, and the blue organic light emitting layer 216 may be considered as one pixel unit. Of course it is possible to select a specific composition and quantities of the sub-pixels included contained in each pixel unit as required. In the context, by way of example, a pixel unit with three above mentioned sub-pixels will be described.

Preferably, the organic light emitting device is an OLED device. Since OLED devices are well known in the art, they will not be described in detail herein.

In the organic light emitting diode array substrate, an organic light emitting diode display and a method for manufacturing the same according to an embodiment of the present disclosure, the reflecting regions are firstly formed on the substrate (e.g., the TFT array substrate), and various color filter photoresist regions are defined, a first pixel definition region being formed on the overlapping region of the color filter photoresist region, so as to increase the height of the first pixel definition region and to reduce the reflectivity of the organic light emitting diode display, while avoiding negative impacts in term of the product aperture ratio and viewing angle optics caused by the original black matrix provided on the cover.

Further, a method for manufacturing an organic light emitting diode array substrate 230 as shown in FIG. 3 comprises the steps of:

forming a reflecting layer 211 on the substrate 210;
forming a photoresist layer 223 on the reflecting layer 211;
forming in turn a pixel electrode layer 213, a second pixel definition region 218, and a first pixel definition region 217 on the photoresist layer, wherein the photoresist layer 223 comprises red, green and blue filter photoresist regions 224, 225 and 226 arranged in sequence. The first pixel definition regions 217 is arranged at overlapping regions of two or three of red, green and blue filter photoresist regions 224, 225 and 226 which are adjacent to each other/one another, and the second pixel definition region 218 is located between the corresponding organic light emitting device 212 and the corresponding first pixel definition region 217; and
forming an organic light emitting layer 214, 215 and 216 of the organic light emitting device 212 on the above mentioned substrate 210 and forming an electrode layer of the organic light emitting device 212 on the organic light emitting layer.

In a specific embodiment, a reflecting layer 211 is firstly defined on the substrate 210, and the reflecting layer 211 includes a plurality of reflecting regions which are made of metal and are spaced apart. Each of the reflecting regions reflects lights emitted from the corresponding organic light emitting device 212 located above it. Then, a photoresist layer 223 is formed on the reflecting layer 211, which includes red, green and blue filter photoresist regions 224, 225, and 226. It is possible to form overlapping regions 227 which are of relative large height when the three color filter photoresist regions are created, the overlapping regions 227 may be obtained by overlapping each two adjacent color filter photoresist regions or the three color filter photoresist regions in all, specific choice of which can be determined specifically by the thickness of box after packaging. Thereafter, the pixel electrode layer 213 (in this example, the anode of the organic light emitting device 212), the second pixel definition region 218, and the first pixel definition region 217 are respectively formed. Specifically, the first pixel definition region 218 is made of a material having a specific liquid-repellent property and is used to define the volume of the ink-jet liquid for forming the organic light emitting layers 214, 215 and 216. The second pixel definition region 218 is made of silicon dioxide and is used to define the final light emitting region.

On the substrate 210, the organic light emitting layers 214, 215, 216 of the organic light emitting device 212 are further produced, which can be made by a solution process or a thermal evaporation deposition, and a combination of both. The electrode layer (in this example, a cathode, such as a transparent conductive electrode) of the organic light emitting device 212 is then made using electron gun evaporation, physical sputtering, or other known processes.

It will be appreciated that the anode, the first pixel definition region, and the second pixel definition region and the like of the organic light emitting device having the predetermined pattern(s) as shown in FIG. 3 can be made firstly by depositing the corresponding layer and then by using techniques known in the art such as photolithography. In view of the fact that lithography is well known in the art, detailed description is omitted here.

In process of making the organic light emitting diode display, it is merely necessary to assembly the above-described organic light emitting diode array substrate 230 and the corresponding cover plate assembly 220 to complete the entire packaging process.

It can be known from above described structure and manufacturing method, as the photoresist layer 223 is formed on the substrate 210 before the organic light emitting device 212, with a thickness of generally 2 μm, and the optical transmittance at the overlapping region 227 therebetween is extremely low, it is believed that light cannot be transversely transmitted into the adjacent sub-pixel region at the overlapping region 227. In this way, both the problem of visual light leakage and light shielding may be avoided, and there will be no problem of asymmetry in the viewing angles. Next, the height of the first pixel definition region 217 may be increased by being set at the overlapping region 227 as compared with the first pixel definition region in the prior art, so as to avoid a risk of overflow when making the organic light emitting layer 212 by ink-jet printing. Finally, in the structural arrangement provided by the embodiment of the present invention, it is possible to avoid the use of the black matrix, or to avoid any consideration of the alignment accuracy when setting the width of the black matrix in a case that the black matrix is used. Further, the width of the black matrix may be increased as much as possible without affecting the light emission of the organic light emitting diode device, such that the finished organic light emitting diode display thus obtained has a relatively low reflectivity.

Figure 4:
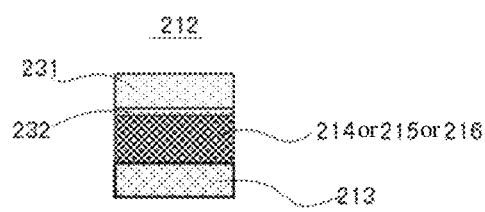
FIGS. 4(*a*) and 4(*b*) are schematic views of an organic light emitting device in an organic light emitting diode display according to other embodiments of the present invention.
Figure 4:
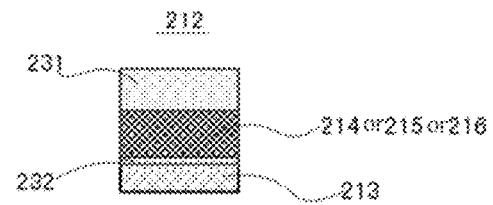

In another embodiment of the present disclosure, there is provided another organic light emitting diode display, a majority structure of which is identical to those as shown in FIG. 3, except that a metal film layer 232 is provided between the cathode 231 of the organic light emitting device and the organic light emitting layer 214, 215 or 216 (See FIG. 4(a)). The metal film layer 232 may be made of magnesium (Mg), indium (In) or a combination of magnesium and indium, or any other suitable material known in the art. That is, as shown in FIG. 4(a), in the present example, it may be considered that the cathode of the organic light emitting device 212 in the present example is a composite electrode composed of the cathode shown in FIG. 3 and the metal film layer 232 described herein. In an optional example, the metal film layer 232 has a pattern identical to the cathode of the organic light emitting device 212.

Specifically, the organic light emitting layers 214, 215, and 216 are formed on the TFT array substrate 210, followed by a process of forming a metal film layer 232, and then another process of forming the cathode.

In one example, as shown in FIG. 4(a), after the organic light emitting layers 214, 215, 216 are formed on the TFT array substrate 210, a metal film layer 232 is firstly formed by thermal evaporation, and then a transparent conductive electrode is formed by evaporation deposition using an electron gun, physical sputtering or other known processes to function as the cathode 231 of the organic light emitting device. Of course, a metal electrode may also be used as the cathode of the organic light emitting device. The metal film layer 232 can reduce the damage to the organic light emitting device upon manufacture of the cathode, while it cooperates with the reflection interface of the ITO anode/photoresist layer 223 of the organic light emitting device to form a stronger micro resonation cavity, so that the color saturation is improved. It will be conceivable that the material of the metal film layer 232 may be selected as desired, such as magnesium (Mg), indium (In) or a combination of magnesium and indium, or an opaque metal material. In another example, as shown in FIG. 4(b), the metal film layer 232 may be formed between the pixel electrode in the pixel electrode layer 213 and a corresponding organic light emitting layer 214, 215, 216.

Herein, it should be noted that the present invention relates only to an improvement of the photoresist layer of the organic light emitting diode display (OLED display) and the organic light emitting device, and therefore only the structure and arrangement related thereto are described in detail. It will be appreciated by those skilled in the art that the organic light emitting diode display described herein may also have some relevant components such as drive circuits and the like.

In the organic light emitting diode array substrate, an organic light emitting diode display and a method for manufacturing the same according to an embodiment of the present disclosure, the reflecting regions are firstly formed on the substrate (e.g., the TFT array substrate), and various color filter photoresist regions are defined, a first pixel definition region being formed on the overlapping region of the color filter photoresist region, so as to increase the height of the first pixel definition region and to reduce the reflectivity of the organic light emitting diode display, while avoiding the negative impact in term of the aperture ratio and viewing angle optic caused by the original black matrix provided on the cover s.

The above content is only some embodiments of the present invention it will be understood by those skilled in the art that various modifications may be made in the present invention without departing from the principles and spirit of the general inventive concept of the present disclosure, and that the scope of the invention is limited by the claims and their equivalents.

What is claimed is:

1. An organic light emitting diode array substrate comprising:
   a substrate;
   a reflecting layer directly contacting the substrate;
   a photoresist layer provided on and directly contacting the reflecting layer; and
   a pixel electrode layer provided on and directly contacting the photoresist layer, wherein the pixel electrode layer is transparent and comprises a plurality of pixel electrodes;
   wherein an organic light emitting layer of an organic light emitting device is provided on the pixel electrode layer, and an electrode layer of the organic light emitting device is provided on the organic light emitting layer;
   wherein the photoresist layer comprises a plurality of red filter photoresist regions, green filter photoresist regions and blue filter photoresist regions arranged in sequence, any adjacent two or adjacent three of the plurality of red filter photoresist regions, green filter photoresist regions and blue filter photoresist regions being overlapped mutually;
   wherein the reflecting layer comprises a plurality of reflecting regions which are made of metal and spaced apart, each reflecting region being arranged in correspondence with pixel electrodes in the pixel electrode layer;
   wherein the organic light emitting device comprises at least one red organic light emitting device, green organic light emitting device and blue organic light emitting device which are arranged in sequence, a first pixel definition region being provided on each overlapping region and a second pixel definition region being provided between the first pixel definition region and a corresponding organic light emitting device;
   wherein the first pixel definition region is higher than the second pixel definition region due to the overlapping region.

2. The organic light emitting diode array substrate according to claim 1, wherein a thickness of the photoresist region is less than or equal to 2 microns.

3. The organic light emitting diode array substrate according to claim 1, wherein one of the pixel electrodes in the pixel electrode layer serves as an anode of a corresponding organic light emitting device, and one of the electrodes in the electrode layer of the organic light emitting device serves as a cathode of the corresponding organic light emitting device.

4. The organic light emitting diode array substrate according to claim 3, wherein the anode is a transparent electrode, and the cathode is a semi-transparent and semi-reflecting electrode or a transparent electrode.

5. The organic light emitting diode array substrate according to claim 1, wherein one of the pixel electrodes in the pixel electrode layer serves as a cathode of a corresponding organic light emitting device, and one of the electrodes in the electrode layer of the organic light emitting device serves as an anode of the corresponding organic light emitting device.

6. The organic light emitting diode array substrate according to claim 5, wherein the cathode is a transparent electrode, and the anode is a semi-transparent and semi-reflecting electrode or a transparent electrode.

7. The organic light emitting diode array substrate according to claim 1, wherein a metal film layer is provided between the pixel electrode in the pixel electrode layer and a corresponding organic light emitting layer.

8. The organic light emitting diode array substrate according to claim 7, wherein the metal film layer is made of magnesium, indium, or a combination thereof.

9. An organic light emitting diode display, comprising
   an organic light emitting diode array substrate according to claim 1; and
   a cover plate assembly.

10. The organic light emitting diode display according to claim 9, wherein the cover plate assembly includes a cover plate and a light barrier disposed on the cover plate at a position corresponding to a first pixel definition region on the organic light emitting diode array substrate.

11. A method for manufacturing an organic light emitting diode array substrate, wherein the organic light emitting diode array substrate is the organic light emitting diode array substrate according to claim 1, and the method comprises the steps of:
   forming the reflecting layer on the substrate;
   forming the photoresist layer on the reflecting layer;
   forming in turn the pixel electrode layer, second pixel definition regions, and first pixel definition regions on the photoresist layer, wherein the photoresist layer comprises red, green and blue filter photoresist regions arranged in sequence, the first pixel definition regions being arranged at overlapping regions of two or three of the red, green and blue filter photoresist regions which are adjacent to each other or one another, and the second pixel definition regions being located between a corresponding organic light emitting device and a corresponding first pixel definition region; and forming the organic light emitting layer of the organic light emitting device on the organic light emitting diode array substrate while forming the electrode layer of the organic light emitting device on the organic light emitting layer.

12. The method according to claim 11, further comprising:
forming a metal film layer followed by forming the electrode layer of the organic light emitting device, after forming the organic light emitting layer on the organic light emitting diode array substrate.

13. The method according to claim 12, further comprising:
forming the metal film layer by thermal evaporation, and forming the electrode layer of the organic light emitting device by electron gun vapor deposition or physical vapor deposition.

14. The method according to claim 11, further comprising:
forming the organic light emitting device by a solution process, a thermal evaporation process, or a combination thereof.

\* \* \* \* \*